United States Patent
Frez et al.

(10) Patent No.: US 9,438,011 B2
(45) Date of Patent: Sep. 6, 2016

(54) SINGLE-MODE, DISTRIBUTED FEEDBACK INTERBAND CASCADE LASERS

(71) Applicant: California Institute of Technology, Pasadena, CA (US)

(72) Inventors: Clifford F. Frez, Arcadia, CA (US); Carl E. Borgentun, Pasadena, CA (US); Ryan M. Briggs, Pasadena, CA (US); Mahmood Bagheri, Pasadena, CA (US); Siamak Forouhar, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 14/824,933

(22) Filed: Aug. 12, 2015

(65) Prior Publication Data

US 2016/0049770 A1    Feb. 18, 2016

Related U.S. Application Data

(60) Provisional application No. 62/036,269, filed on Aug. 12, 2014.

(51) Int. Cl.
*H01S 5/00* (2006.01)
*H01S 5/34* (2006.01)
*H01S 5/12* (2006.01)
(Continued)

(52) U.S. Cl.
CPC ........... *H01S 5/3402* (2013.01); *H01S 5/0425* (2013.01); *H01S 5/1003* (2013.01); *H01S 5/125* (2013.01); *H01S 5/1237* (2013.01);
(Continued)

(58) Field of Classification Search
CPC .. H01S 5/3402; H01S 5/1237; H01S 5/2205; H01S 5/1003; H01S 5/125; H01S 5/187; H01S 5/3401
USPC ........................................................ 372/45.01
See application file for complete search history.

(56) References Cited

U.S. PATENT DOCUMENTS 5,953,356 A * 9/1999 Botez ..................... B82Y 20/00
                                                          372/45.01
6,326,646 B1 * 12/2001 Baillargeon ........... B82Y 20/00
                                                            257/94
(Continued)

OTHER PUBLICATIONS

Briggs et al., "Single-mode 2.65 μm InGaAsSb/AlInGaAsSb laterally coupled distributed-feedback diode lasers for atmospheric gas detection", Opt. Express, 21, 2013, pp. 1317-1323.
(Continued)

*Primary Examiner* — Kinam Park
(74) *Attorney, Agent, or Firm* — KPPB LLP

(57) ABSTRACT

Single-mode, distributed feedback interband cascade lasers (ICLs) using distributed-feedback gratings (e.g., lateral Bragg gratings) and methods of fabricating such ICLs are provided. The ICLs incorporate distributed-feedback gratings that are formed above the laser active region and adjacent the ridge waveguide (RWG) of the ICL. The ICLs may incorporate a double-ridge system comprising an optical confinement structure (e.g., a RWG) disposed above the laser active region that comprises the first ridge of the double ridge system, a DFB grating (e.g., lateral Bragg grating) disposed above the laser active region and adjacent the optical confinement structure, and an electric confinement structure that passes at least partially through the laser active region and that defines the boundary of the second ridge comprises and the termination of the DFB grating.

20 Claims, 10 Drawing Sheets

(51) Int. Cl.
  H01S 5/22    (2006.01)
  H01S 5/042   (2006.01)
  H01S 5/10    (2006.01)
  H01S 5/125   (2006.01)
  H01S 5/187   (2006.01)
(52) U.S. Cl.
  CPC ............ *H01S 5/187* (2013.01); *H01S 5/2205* (2013.01); *H01S 5/3401* (2013.01)

(56) References Cited

U.S. PATENT DOCUMENTS

| | | | | |
|---|---|---|---|---|
| 7,408,966 B2 * | 8/2008 | Botez | .................... | B82Y 20/00 372/43.01 |
| 2013/0221223 A1 * | 8/2013 | Caneau | ............... | H01S 5/18308 250/340 |
| 2014/0355637 A1 * | 12/2014 | Hashimoto | .......... | H01S 5/3401 372/45.012 |

OTHER PUBLICATIONS

Canedy et al., "High-power, narrow-ridge, mid-infrared interband cascade lasers", Journal of Crystal Growth, 2007, vol. 301-302, pp. 931-934.

Canedy et al., "High-power, narrow-ridge, mid-infrared interband cascade lasers", Journal of Vacuum Science & Technology, 2008, B26, pp. 1160-1162.

Choi et al., "Evaluation of Coupling Coefficients for Laterally-Coupled Distributed Feedback Lasers", Jpn. J. Appl. Phys., 1996, vol. 35, pp. 4654-4659.

Forouhar et al., "High-power laterally coupled distributed-feedback GaSb-based diode lasers at 2μm wavelength", Applied Physics Letters, 2012, vol. 100, pp. 031107-1-031107-4.

Forouhar et al., "Reliable mid-infrared laterally-coupled distributed-feedback interband cascade layers", Applied Physics Letter, 2014, vol. 105, 4 pgs.

Gupta et al., "Modal Gain of 2.4-μm InGaAsSb-AlGaAsSb Complex-Coupled Distributed-Feedback Lasers", IEEE Photonics Technology Letters, Oct. 15, 2009, vol. 21, No. 20, pp. 1532-1534.

Gupta et al., "Single mode 2.4 μm InGaAsSb/AlGaAsSb distributed feedback lasers for gas sensing", Applied Physics Letter, 2009, vol. 95, pp. 041104-1-041104-3.

Keil et al., "Oxide dual Damascene Trench Etch Profile Control", Journal of The Electrochemical Society, 2001, vol. 148, No. 7, pp. G383-G388.

Kim et al., "Corrugated-sidewall interband cascade lasers with single-mode midwave-infrared emission at room temperature", Applied Physics Letters, 2009, vol. 95, pp. 231103-1-231103-4.

Kim et al., "Mid-infrared distributed-feedback interband cascade lasers with continuous-wave single-mode emission to 80 degrees C", Applied Physics Letter, 2012, vol. 101, pp. 061104-1-061104-3.

Lehnhardt et al., "Continuous wave single mode operation of GaInAsSb/GaSb quantum well lasers emitting beyond 3 μm", Applied Physics Letters, 2008, vol. 92, pp. 183508-1-183508-3.

Salhi et al., "Single-frequency SB-based distributed-feedback lasers emitting at 2.3 μm above room temperature for application in tunable diode laser absorption spectroscopy", Applied Optics, Jul. 10, 2006, vol. 45, No. 20, pp. 4957-4965.

Streifer et al., "Coupling Coefficients for Distributed Feedback Single- and Double-Heterostructure Diode Lasers", IEEE Journal of Quantum Electronics, Nov. 1975, vol. QE-11, No. 11, pp. 867-873.

Vurgaftman et al., "Rebalancing of internally generated carriers for mid-infrared interband cascade lasers with very low power consumption", Nature Communications, Dec. 13, 2011, 7 pgs.

* cited by examiner

SINGLE-MODE, DISTRIBUTED FEEDBACK INTERBAND CASCADE LASERS

CROSS-REFERENCE TO RELATED APPLICATIONS

This application claims the benefit of and priority under 35 U.S.C. §119(e) to U.S. Provisional Patent Application Ser. No. 62/036,269 entitled "Fabrication of Single-Mode, Distributed Feedback Interband Cascade Lasers Using Second-Order Lateral Bragg Gratings," filed Aug. 12, 2014, which is incorporated herein by reference in its entirety for all purposes.

STATEMENT OF FEDERAL SUPPORT

The invention described herein was made in the performance of work under a NASA contract, and is subject to the provisions of Public Law 96-517 (35 USC 202) in which the Contractor has elected to retain title

FIELD OF THE INVENTION

The present invention generally relates to interband cascade lasers and methods of manufacturing such lasers; and more specifically to interband cascade lasers using second-order lateral Bragg gratings.

BACKGROUND

Tunable laser absorption spectroscopy (TLAS) refers to techniques and methods used for detecting and measuring certain gas concentrations with the use of tunable diode lasers. TLAS utilizes absorption of laser emissions and absorption spectrometry to measure the concentration of certain gases in a gas mixture. The exact wavelength of the laser emission coincides with the absorption of molecular transitions of the constituent molecules of the specific gas. Together with techniques such as wavelength modulation spectroscopy, TLAS with simple absorption cells is capable of detection limits on the order of parts per million, which is sufficient for many applications of interest. The mid-infrared region from 3 to 5 µm presents particular promise since it contains several strong absorption features of scientifically important species in atmospheric science and environment monitoring, such as hydrogen chloride, water, methane, ethane, and other alkanes. Several laser sources are suitable for these techniques. In particular, interband cascade lasers (ICLs) based on the GaSb material system are well suited for high-power single-mode emission in the 3 to 5 µm wavelength range.

A common method of realizing monolithic, single-mode operation of ICLs is to incorporate a distributed feedback (DFB) grating. As typical buried-grating designs are impractical for GaSb-based devices due to issues with overgrowth in the material system, the Bragg grating must be incorporated into the design through different approaches. For instance, in some designs, a metal Bragg grating can be deposited on top of a ridge waveguide (RWG). Other designs are based on etching vertical corrugations in the sidewalls of the RWG. These corrugations can not only serve as a Bragg grating, but can also suppress higher-order lateral optical modes by introducing scattering losses at the edges of the RWG.

SUMMARY OF THE INVENTION

The present disclosure provides embodiments directed to interband cascade lasers and methods of manufacturing such lasers.

Many embodiments are directed to interband cascade lasers including:
- a substrate having disposed there atop an active region of semiconductor quantum well structures and at least one confinement layer disposed atop and below the active region;
- an elongated waveguide ridge disposed atop the top confinement layer having characteristic width and length dimensions and being formed of a plurality of epitaxial layers, the longitudinal dimension of the waveguide ridge defining a laser cavity configured to employ intersubband electronic transitions;
- a current confining ridge having a characteristic current confining width, the current confining ridge extending distally from the lateral edge of the waveguide ridge to a terminating edge, the terminating edge extending through both the top confinement layer and at least partially through the active region such that lateral current spread from said waveguide ridge is impeded from propagating beyond said terminating edge;
- a pair of distributed feedback gratings comprising a plurality of periodic vertical corrugations disposed atop the current confining ridge adjacent to the longitudinal edges of the waveguide ridge and extending outward from the longitudinal edges of the waveguide ridge to the terminating edge of the current confining ridge in a plurality of laterally extending parallel rows, wherein the corrugations have characteristic modulation depth and pitch, and wherein the corrugations are disposed through the top confinement layer, but do not penetrate the active region;
- a dielectric layer conformally disposed atop the distributed feedback grating;
- a conductive contact layer disposed atop the dielectric layer and elongated waveguide ridge;
- wherein the width of the waveguide ridge and the modulation depth and pitch of the corrugations are configured such that the corrugations have a coupling coefficient sufficient to interact with the active region of the laser to impose single-mode emission at specific engineered wavelengths thereon; and
- wherein the width of the current confining ridge is configured such that the terminating edge does not interact with the optical coupling of the waveguide ridge and the corrugations.

In some embodiments the corrugations have an open profile having a modulation depth, d, that is equal to or less than the pitch, $\Lambda$, of the periodic vertical corrugations such that the aspect ratio of the corrugations, $d/\Lambda$ is less than 1.

In other embodiments the dielectric layer is formed of a material at a thickness sufficient to isolate the optical mode guided by the laser waveguide from the conductive contact later, wherein the dielectric material is transparent at the laser emission wavelength, and wherein the dielectric material has a lower refractive index than the effective index of the laser active region thereby confining light to the laser ridge.

In still other embodiments the dielectric layer is configured to allow for the conduction of thermal energy from the active region into the contact layer.

In yet other embodiments the waveguide has a width of from 3 to 6 µm.

In still yet other embodiments the current confining ridge has a width of from 8 to 12 µm.

In still yet other embodiments the portion of the current confining ridge on each side of the waveguide has a width at least as great as the width of the waveguide.

In still yet other embodiments the terminating edge extends completely through the active region to the bottom confinement layer.

In still yet other embodiments the corrugations form a lateral Bragg grating. In some such embodiments the Bragg grating is a second-order Bragg grating.

In still yet other embodiments the waveguide and distributed feedback gratings are dimensions to produce a laser emission within a waveband of 3 to 6 μm.

Many other embodiments are directed to methods of forming an interband cascade layer including:

epitaxially growing an ICL wafer atop a substrate, the ICL wafer comprising at least an active region of semiconductor quantum well structures and at least one confinement layer disposed atop and below the active region, and further comprising at least an upper cladding layer disposed atop the top confinement layer;

lithographically patterning and etching an elongated waveguide ridge having characteristic width and length dimensions, the longitudinal dimension of the waveguide ridge defining a laser cavity configured to employ intersubband electronic transitions through the upper cladding layer such that the elongated waveguide ridge is disposed atop the top confinement layer;

epitaxially growing a further cladding layer atop the waveguide ridge;

lithographically patterning a distributed feedback grating comprising a plurality of vertical corrugations extending outward from the longitudinal edges of the waveguide ridge in a plurality of laterally extending parallel rows;

plasma etching the patterned plurality of vertical corrugations into the ICL wafer such that the corrugations have characteristic modulation depth and pitch, and such that the corrugations are disposed through the top confinement layer, but do not penetrate the active region;

lithographically patterning a current confining ridge having a characteristic current confining width, the current confining ridge extending distally from the lateral edge of the waveguide ridge to a terminating edge;

plasma etching current confining ridge such that the plurality of corrugations between the terminating edges and the waveguide ridge are preserved, and such that the terminating edge extends through both the top confinement layer and at least partially through the active region such that lateral current spread from said waveguide ridge is impeded from propagating beyond said terminating edge;

vapor depositing a dielectric layer conformally atop the distributed feedback grating;

electrodepositing a conductive contact layer atop the dielectric layer and elongated waveguide ridge;

wherein the width of the waveguide ridge and the modulation depth and profile of the corrugations are configured such that the corrugations have a coupling coefficient sufficient to interact with the active region of the laser to impose single-mode operation and emission at specific engineered wavelengths thereon; and wherein the width of the current confining ridge is configured such that the terminating edge does not interact with the optical coupling of the waveguide ridge and the corrugations.

In some embodiments the plasma etching utilizes an anisotropic non-selective plasma etching process.

In other embodiments the corrugations have an open profile having a modulation depth, d, that is equal to or less than the pitch, $\Lambda$, of the periodic vertical corrugations such that the aspect ratio of the corrugations, $d/\Lambda$ is less than 1.

In still other embodiments the dielectric layer is formed of a material at a thickness sufficient to isolate the optical mode guided by the laser waveguides from the contact later, and to allow for the conduction of thermal energy from the active region into the contact layer, wherein the dielectric material is transparent at the laser emission wavelength, and wherein the dielectric material has a lower refractive index than the effective index of the laser active region thereby confining light to the laser ridge.

In yet other embodiments the waveguide has a width of from 3 to 6 μm.

In still yet other embodiments the current confining ridge has a width of from 8 to 12 μm.

In still yet other embodiments the portion of the current confining ridge on each side of the waveguide has a width at least as great as the width of the waveguide.

In still yet other embodiments the terminating edge extends completely through the active region to the bottom confinement layer.

In still yet other embodiments the corrugations form a lateral Bragg grating. In some such embodiments the lateral Bragg grating is a second-order lateral Bragg grating.

In still yet other embodiments the waveguide and distributed feedback gratings are dimensions to produce a laser emission within a waveband of 3 to 6 μm.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as various embodiment of the disclosure and shot not be construed as a complete recitation of the scope of the disclosure, wherein.

DETAILED DESCRIPTION

Figure 1:
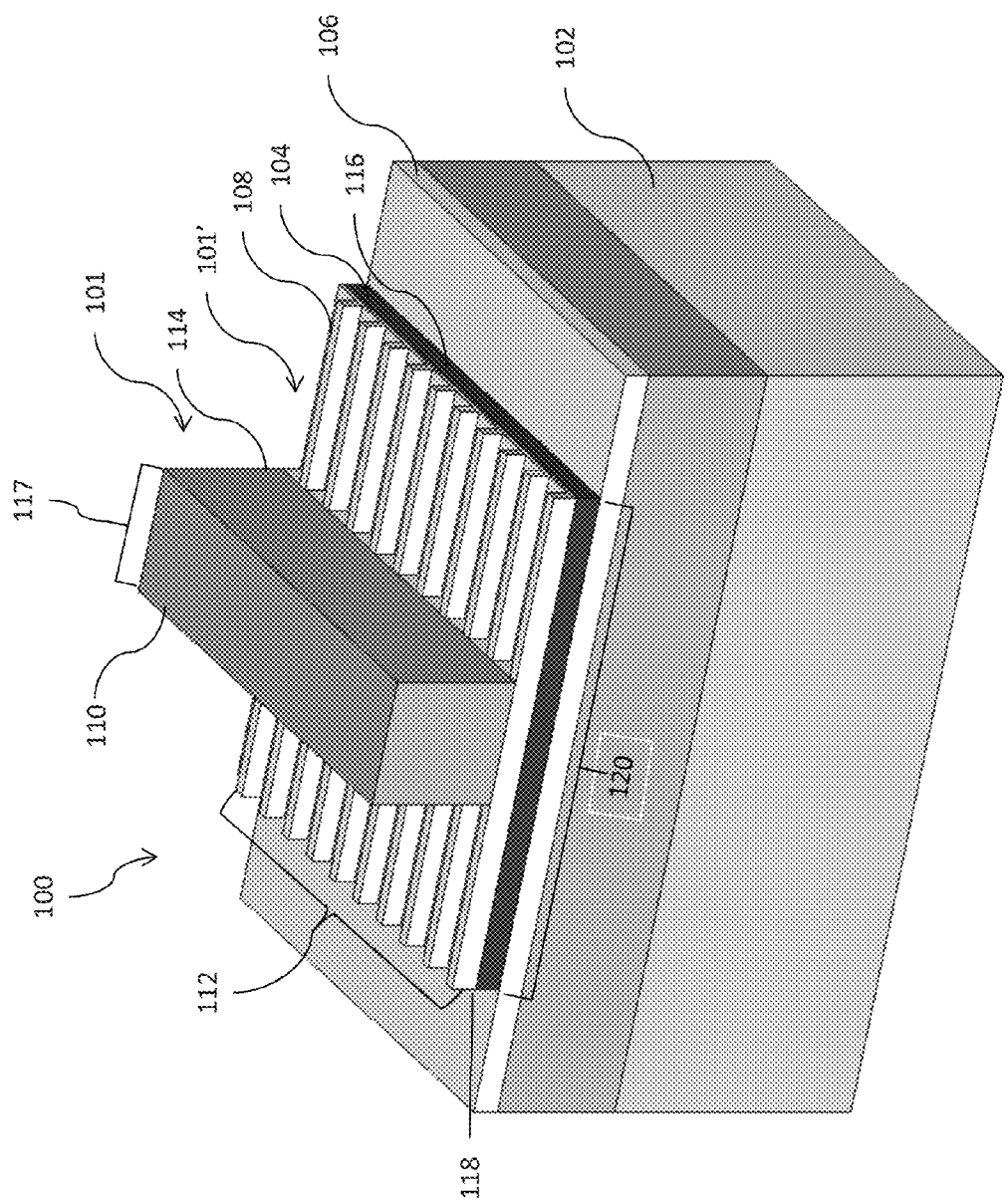
FIG. 1 provides a schematic of a interband cascade laser in accordance with embodiments of the invention.

The present disclosure may be understood by reference to the following detailed description, taken in conjunction with the drawings as described below. It is noted that, for purposes of illustrative clarity, certain elements in various drawings may not be drawn to scale.

In accordance with the provided disclosure and drawings, single-mode, distributed feedback interband cascade lasers (ICLs) using distributed-feedback gratings (e.g., lateral Bragg gratings) and methods of fabricating such ICLs are provided. In many embodiments, the ICLs incorporate distributed-feedback gratings that are formed above the laser active region and adjacent the ridge waveguide (RWG) of the ICL. Many embodiments of the distributed-feedbacks (DFB) gratings are deposited directly into the semiconductor cladding layers disposed above the laser active region. In some embodiments, the ICLs incorporate a double-ridge system comprising an optical confinement structure (e.g., a RWG) disposed above the laser active region that comprises the first ridge of the double ridge system, a DFB grating (e.g., lateral Bragg grating) disposed above the laser active region and adjacent the optical confinement structure, and an electric confinement structure that passes at least partially through the laser active region and that defines the boundary of the second ridge comprises and the termination of the DFB grating. ICLs incorporating such second-order lateral Bragg gratings in accordance with embodiments of the invention are discussed further below.

ICLs typically use interband electronic transitions to produce a laser emission over the mid-infrared range of the electromagnetic spectrum. Compared with non-semiconductor-based laser technologies, ICLs can be made more compact and power efficient, ultimately leading to more portable, robust, and manufacturable spectroscopy instruments. ICLs are typically fabricated from epitaxially-grown semiconductor material composed of layers of different alloys. In many embodiments, the epitaxial wafer includes an active region between two GaSb separate confinement layers (SCLs). The active region and SCLs are further sandwiched between two cladding layers.

Bragg gratings have been previously utilized for monolithic, single-mode operation, which is required for selectively interrogating single molecular absorption lines. Since buried-heterostructure devices are difficult to fabricate with GaSb-matched epitaxial structures, ICLs are commonly fabricated as a ridge waveguide (RWG) structure with deposited dielectric cladding layers. Integration of a Bragg grating as part of the laser structure has previously been realized through two different methods. In one case, high-index-contrast top gratings have been deposited on an ICL structure with reduced top-cladding thickness, and in another case, corrugations penetrating the laser active region have been etched into the ICL structure. (See, e.g., U.S. patent application Ser. No. 14/711,695, filed May 13, 2015, which is incorporated herein by reference.) Plasma etching of gratings into the sidewalls of an ICL ridge waveguide structure presents several disadvantages, including difficultly in controlling etch profile and pattern fidelity over an etch depth of several microns, which limits the minimum feature size of the grating, as well as reliability concerns related to etching through the laser active region (e.g., exposure and possible degradation of the active layers during fabrication, which can trigger long-term reliability issues). Without the ability to pattern sub-micron features, previous demonstrations of single-mode ICLs with sidewall gratings have made use of higher-order diffraction gratings, which leads to optical loss into lower diffraction orders. Furthermore, introducing sidewall corrugations increases the exposed surface area of the laser active region and creates a higher probability of surface defect states in a region of high electric field intensity. In contrast to plasma-etched Bragg gratings, type-I DFB lasers have also been formed using deposited metal gratings. However, these devices have been shown to incur considerable optical loss, which limits laser output power due to optical absorption, and the same can be expected when applied to type-II ICLs. (See, e.g., C. S. Kim, et al., Appl. Phys. Lett. 101(6), 061104 (2012).)

Accordingly, single-mode DFB ICLs, which must incorporate a narrow ridge as well as a grating to impose single-longitudinal-mode operation, present several design challenges that can lead to limited output power and device reliability. For applications such as cavity ring-down spectroscopy, lidar, and injection seeding of high-power solid-state lasers, where tens of milliwatts of single-mode optical power is required, progress still remains to be made in producing reliable DFB ICLs.

Embodiments of single-mode DFB ICLs and their method of manufacture are now presented that avoid etching gratings through the laser active region, yet do not introduce additional optical loss by reliance on deposited metal gratings. In many such embodiments an ICL is provided incorporating a narrow ridge waveguide optical confinement structure having shallow lateral gratings (e.g., laterally-coupled DFBs) etched adjacent thereto and directly into the semiconductor cladding layers above the laser active region, while an additional etch is used to pattern a wider ridge structure centered about the ridge waveguide through the active region to form an independent electric confinement structure. These ICLs and fabrication methods ultimately allow for independent patterning of the optical confinement structure, the distributed-feedback grating, and the electric confinement structure, which addresses each fabrication step individually and allows for optimized performance and reliability.

Embodiments Incorporating Distributed-Feedback Grating Structures

Many embodiments are directed single-mode ICL lasers suitable for spectroscopy instruments capable of emitting at high power (e.g., greater than 20 mW and in some cases 40 mW) over a wide temperature range (e.g., greater than 0° C. and in some cases greater than 20° C.). In particular, optoelectronic designs and fabrication processes according to embodiments are presented that increase ICL laser single-mode power output for devices emitting in the 3 to 5 μm wavelength range. Such embodiments yield single-mode lasers with low operating current, above-room-temperature operation with output powers exceeding 15 mW, and single-mode emission with at least 25 dB side-mode suppression. The ICL devices show comparable output power and spectral stability to comparable device, with the additional capability to independently define the optical and electrical confinement structures as well as the distributed-feedback grating, allowing for greater flexibility in design and enabling improved device yield and reliability.

As shown schematically in FIG. 1, in many embodiments the inter-cascade lasers (ICLs) comprise a multilayer structure (100) having both optical (101) and current (101') confinement elements formed atop a suitable cladding substrate. In an exemplary embodiment the substrate (102) is formed from an n-GaSb layer, however any suitable substrate material may be used, including GaAs and InP. Atop this substrate are deposited an ICL active region (104), which may be one or a plurality of layers, surrounded atop and below by one or more separate confinement layers (SCLs) (106 & 108). In many embodiments, the active region includes seven ICL stages. In some embodiments, the top and bottom SCLs can be composed of GaSb. An optical confinement ridge waveguide (RWG) (110) fabricated from epitaxial layers is disposed atop the upper SCL (108). In exemplary embodiments, the active region may be formed with any suitable two-phonon extraction structure from InGaAs/AlInAs epitaxial lasers, although other alloys matched to InP, GaAs, or GaSb may be selected, and the unique aspects of the lasers could be applied to other optimized active region designs at various wavelengths based on the desired laser performance.

In many embodiments a distribute-feedback grating (DFB) (e.g., a lateral Bragg grating) (112) is patterned and disposed into the top SCL (108) directly adjacent to the sidewalls (114) of the RWG (110) such that the DFB grating does not penetrate into active region (104) of the ICL. Finally, a second current confinement ridge (116) is formed by etching away the top SCL (108) and at least a portion of the active region (104) down to or into the bottom SCL (106) at a distance along the DFB grating (112) distal to the sidewalls (114) of the RWG (110).

Turning to the construction of the optical confinement RWG (110) of the ICLs, in accordance with many embodiments, the ridge is formed with a substantially uniformly narrow ridge width (117) along the length thereof. Although suitable RWG widths may vary, in many embodiments the width of the RWG is constrained such that the ridge supports only one lateral optical mode of a polarization matched to the polarization of light emitted in the active region. In many embodiments the waveguide ridge width (117) is narrower than the free-space wavelength of the laser emission. In many embodiments, the width of the RWG is chosen based on numerical calculations such that the RWG supports a single transverse mode while a reasonable amount of the evanescent electrical field extends outside of the ridge area such that the electrical field couples to at least a portion of the adjacent LC-DFB grating (112). In some embodiments a waveguide ridge width of around 3 to 5 μm may be used. Constraining the width of the waveguide ridge in accordance with embodiments allows for a relatively small absolute current to be sourced through the laser while achieving the relatively large current densities required to reach laser threshold, which ultimately reduces both power consumption and heat generation.

As shown in FIG. 1, the second ridge (116) of the ICL comprises the LC-DFB grating (112). In many embodiments the LC-DFB grating (112) extends laterally in parallel rows on either side of the sidewalls of the RWG (110) to the termination of the second ridge (116) to form a distributed-feedback grating that imposes single-mode laser operation on the laser (i.e., provides optical mode confinement). The profile of the LC-DFB grating will depend on the interaction strength required to impose single-mode operation on the active region of the ICL. In many embodiments, the LC-DFB grating is disposed through the full vertical height of the upper SCL (108), but does not penetrate the active region (104) of the ICL. The modulation depth (i.e., the lateral depth that the grating corrugation cuts into the upper SCL of the second ridge of the ICL), and tooth profile (i.e., shape and period) of the corrugation of the grating can be precisely patterned to provide optimal grating interaction strength for a given ridge width and cavity length (i.e., longitudinal length of the waveguide ridge). In some embodiments, a LC-DFB grating may be designed having a modulation depth, d, that is equal to or less than the pitch, Λ, of the periodic corrugations (i.e. the aspect ratio, d/Λ is less than 1). Likewise, in some embodiments the tooth profile of the LC-DFB grating may be provided with a sinusoidal corrugation or other open shape. Alternatively, gratings having alternative tooth profiles with sharper corners, such as rectangles or triangles, or larger modulation depths, it has been discovered that such structures are prone to manufacturing defects, such as mask erosion at the sharp corners that can result in non-uniform vertical etch profiles that results in unpredictable final ridge geometries. Furthermore, the open profile defined above enables uniform deposition of dielectric material into the corrugations by conventional non-epitaxial techniques (including plasma-enhanced chemical vapor deposition and physical vapor deposition) without introducing voids or other non-uniformities that can induce optical loss through scattering. In many embodiments, a suitable design of sidewall grating (e.g., modulation depth and tooth profile) may be selected by determining the optical mode profile of the active region and a suitable coupling coefficient, K. In some such embodiments the coupling coefficient may be calculated using a suitable coupled-mode theory approximation, such as is described, for example, in W. Streifer, et al., IEEE J. Quantum Electron. 11, 867-873 (1975), the disclosure of which is incorporated herein by reference.

As further shown in the schematics, the second current confinement ridge (116) is etched along an edge distal to the RWG at least partially through the active layer (104) forming a distal terminal edge (118) that truncates the second ridge such that any lateral current spreading through the LC-DFB grating is prevented from propagating beyond said distal edge. Although in some embodiments the depth of the distal edge (e.g., the etch depth of the second ridge) penetrates only sufficiently far through the active layer to prevent current spreading through said distal edge, in many embodiments the distal terminal edge penetrates through the entire active layer and either stops at the lower SCL or continues at least partially into the lower SCL. Turning to the other dimensions of the current confinement structure, the second ridge width (120) is sufficiently wide on either side of the RWG such that the lateral current spreading is limited by the terminal distal edge (118), while the terminal edge is positioned sufficiently far from the sidewalls of the RWG such that it does not affect or interact with the fundamental optical mode or the coupling of the light in the RWG with the LC-DFB grating. In many embodiments the second ridge width on either side of the RWG comprises a width at least equal to the width of the RWG. In some embodiments the second ridge width (120) from end to end centered on the RWG is from at least 8 to 15 μm.

Embodiments of the LC-DFB devices demonstrate several improvements. First, by etching gratings only a few hundred nanometers into the semiconductor structure, smaller feature sizes can be used while retaining a high degree of pattern fidelity. Accordingly, in many embodiments second-order DFB gratings may be formed. In embodiments of ICLs thus formed, these second-order gratings may be operated with a 25% duty cycle that minimizes the possibility of loss into lower diffraction orders when compared with higher-order DFB ICLs fabricated with larger feature sizes and deep-etched gratings. Lower-order gratings also allow for stronger DFB coupling for the same modal overlap. Second, although it is necessary to etch the LC-DFB gratings, the resulting smooth, flat sidewalls are comparable to benchmark devices. Compared with DFB devices with corrugations etched through the active region, the two-ridge approach in accordance with embodiments minimizes exposed surface area of the active region and does not require passivation of small concave features. Overall, by forming a waveguide ridge with LC-DFB gratings in accordance with the embodiments, a laser having low power consumption may be obtained.

Although the above discussion has focused on the active structures and regions of the ICL, it should be understood that in many embodiments other layers and structures may be disposed atop these to make an operative ICL device. Accordingly, in many embodiments atop the active regions (e.g., the RWG, the LC-DFB and second ridge) a cladding layer, such as, for example, formed from an InP or other equivalently suitable epitaxial material may be disposed. Above this structure a dielectric and conductive contact may be disposed to complete the structure. With respect to the dielectric barrier and contact layers it will be understood that any suitable materials, such as may be known in the prior art may be used to form these structures. For example, in many embodiments the dielectric layer may be made from aluminum nitride (AlN) or silicon nitride. In some embodiments the dielectric layer has a thickness of less than 1 μm. Likewise, the conductive contacts may be made from any suitable conductive material, such as, for example, a conductive metal such as Au, Ag, Pt, Pd, Cu, etc. Preferably the contact layer is sufficiently thick to serve as a heat sink to the laser. In some such embodiments a contact layer comprising a conductive metal of at least 5 μm is used.

In many embodiments, the dielectric cladding layer is formed of a material at a thickness sufficient to isolate the optical mode guided by the laser waveguides from metallic electrical contacts, while being simultaneously thin enough to allow for some thermal extraction through the cladding to the conductive contact layer. In many embodiments, the dielectric cladding layer is transparent at the laser emission wavelength and has a lower refractive index than the composite index of the laser active region so that it confines light to the laser ridge. In some embodiments the dielectric cladding layer is formed of AlN or silicon nitride material having a thickness of less than 1 μm, and typically 0.5 μm.

Embodiments of Methods of Fabricating Distributed-Feedback Grating Structures

Embodiments are also directed to methods of forming ICLs having a double-ridge construction that allows for independent patterning of an optical confinement structure, a distributed-feedback grating, and an electric confinement structure, and which allows for each of these elements to be optimized for performance and reliability. Moreover, embodiments of such laser fabrication processes are greatly simplified compared with the multiple regrowth steps required to obtain buried heterostructure lasers with similar performance in conventional methods.

Figure 2:
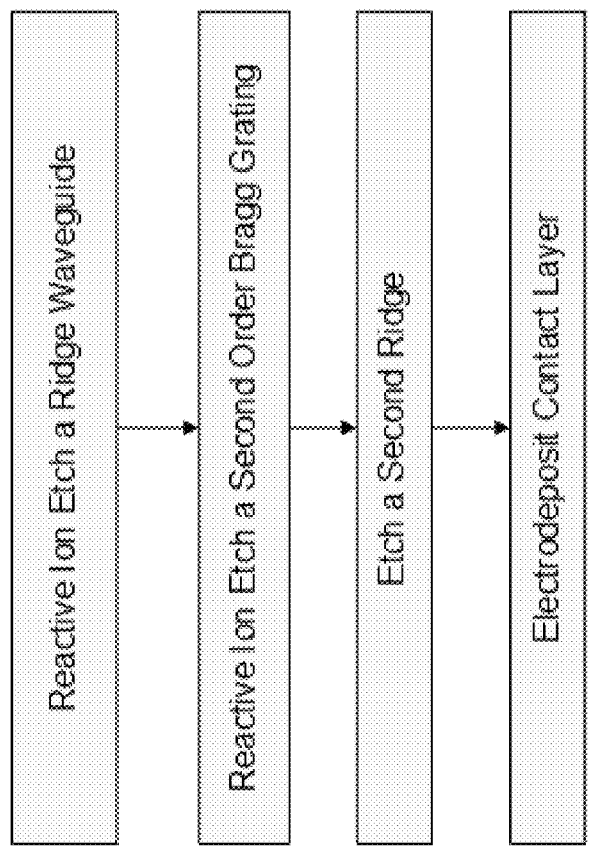
FIG. 2 provides a flowchart providing methods of fabricating interband cascade lasers in accordance with embodiments of the invention.

Accordingly many embodiments are directed to fabrication methods for single-mode DFB (distributed feedback) ICLs wherein a narrow optical confinement ridge with shallow lateral gratings are etched directly into the semiconductor cladding layers of a substrate above the laser active region, while an additional etch is used to pattern a wider current confinement ridge structure through the active region. As shown in the flowchart in FIG. 2, in many embodiments the fabrication process involves three plasma etching steps to define first an optical confinement structure (e.g. narrow RWG), the DFB grating (e.g., second order Bragg grating), and the electrical confinement structure (e.g., second ridge) in a semiconductor ICL wafer.

Turning to the details of the three plasma etching steps for defining the optical and electrical confinement structures in accordance with embodiments, initially the process requires the provision of a semiconductor ICL wafer. It should be understood that the semiconductor ICL wafer may be made by any suitable means including, for example, by deposited the waveguide ridge, including the active region and cladding on a suitable substrate via epitaxial growth. With respect to the formation of such epitaxial layers, any suitable technique may be used such as, for example, molecular beam epitaxy, which provides precise thickness control, sharp layer interfaces, and controlled doping, or alternative processes, such as, for example, metal-organic chemical vapor deposition. Likewise, the patterning and etching steps may utilize any suitable technique or techniques including, for example, photolithography, ebeam lithography, and plasma etching.

Figure 3:
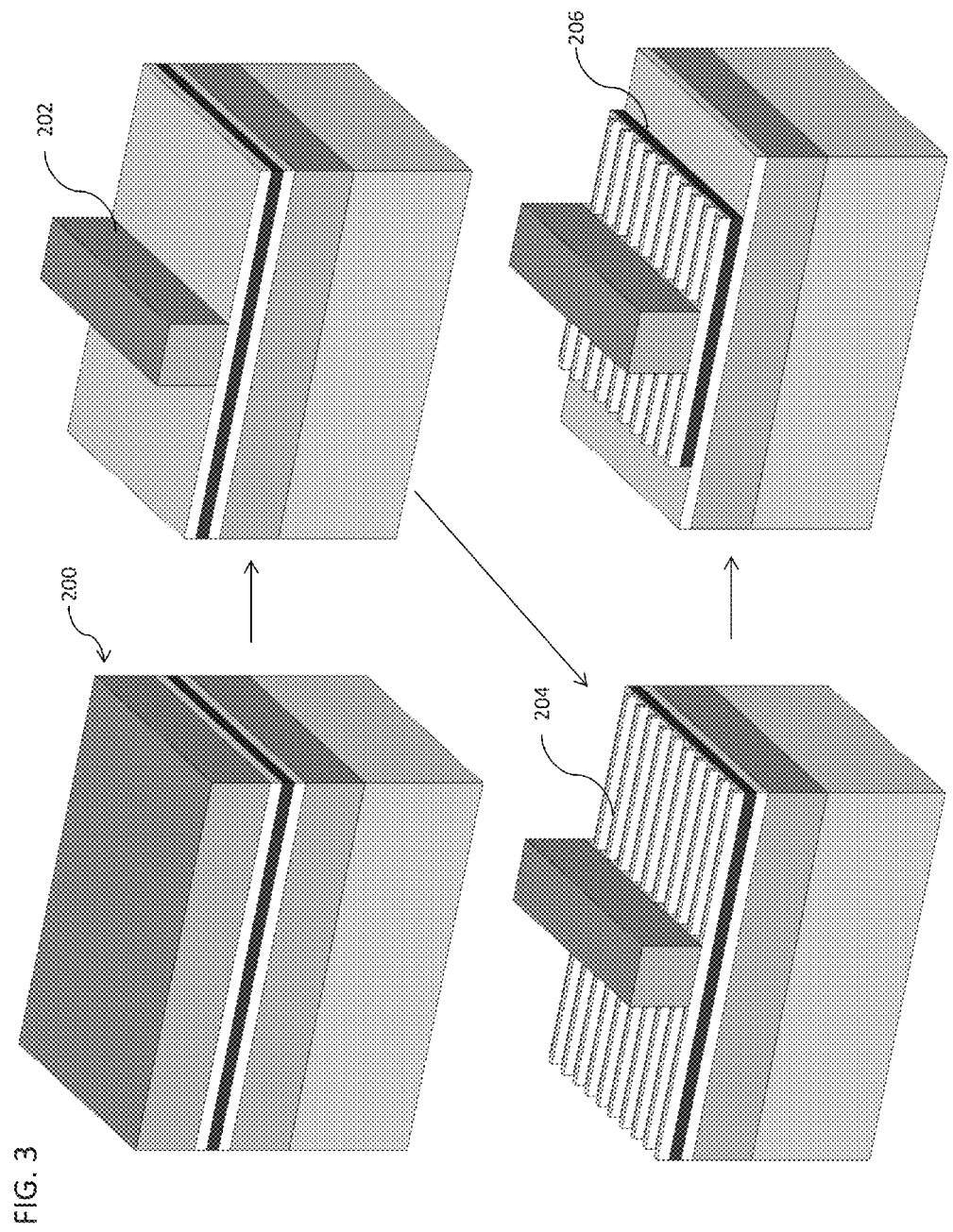
FIG. 3 provides a schematic of a process for fabricating interband cascade lasers in accordance with embodiments of the invention.

In many embodiments, as shown schematically in FIG. 3, a standard ICL wafer (200) designed for emission at desired wavelengths (e.g., from 3 to 6 μm or near 3.5 μm) and grown by molecular beam epitaxy (e.g., GaSb-based) is provided. Then, a narrow ridge waveguide (202) (e.g., on the order of 4 μm wide) is defined using a suitable technique, such as, for example, via conventional photolithography. This RWG is then etched into the laser cladding layers but not through the active region by a suitable technique, such as, for example, by plasma or wet etching. Next, suitable DFB gratings (204) (e.g., lateral second-order Bragg gratings) are patterned adjacent to, and on either side, of the RWG sidewall using a suitable technique, such as, for example, via electron-beam lithography. The DFB grating pattern in accordance with embodiments may then be transferred into the laser structure using a suitable technique, such as, for example, a shallow plasma etch that maintains high pattern fidelity and compatibility with small feature sizes. Finally, a second ridge (206) having a suitable width (e.g., approximately 11 μm wide), aligned to the patterned RWG may be delineated using an additional photolithography process, such as, for example, via photo or electron beam lithography. The second ridge (206) is then transferred through the laser active region to prevent lateral current spreading via a suitable etching technique, such as, for example, plasma etching.

Although the above discussion has focused on the formation of the active structures of the ICLs in accordance with embodiments, it will be understood that following these processes, additional techniques may be used to complete the laser. For example, in many embodiments a dielectric film may be deposited by plasma-enhanced chemical vapor deposition for electrical isolation, and then a narrow strip of the dielectric removed from the top of the RWG to allow a contact to be formed. To ensure adequate heat extraction, in many embodiments, a thick gold pad may be electroplated on top of the laser ridge. In some embodiments, once these contact structures are in place, the wafer substrate may be reduced to a suitable operating thickness (e.g., approximately 100 μm), and an ohmic back contact may be deposited. In further embodiments, the wafer may then be cleaved to form laser cavities, and optical coatings may be deposited onto the laser facets to improve mode stability and light extraction efficiency.

Techniques in accordance with the embodiments enable for the fabrication of low-loss, low-order gratings without etching high-aspect-ratio corrugations, while facilitating better current confinement by using a straight etch through the ICL active region at a distance far from where the optical mode is generated. As will be discussed in greater detail below, processed in accordance with embodiments have resulted in a high yield of lasers with low operating current, above-room-temperature operation and output powers exceeding 15 mW operating at single-mode emission with at least 25 dB side-mode suppression. Moreover, embodiments of the fabrication technique allow for the preservation of the critical dimensions of lower-order lateral gratings by separating the ridge waveguide and grating fabrication steps. Furthermore, by removing the active region beyond the distance of optical mode generation, it is possible to minimize current spreading and reduced reliability concerns that arise when the active region is exposed close to the sidewall of the ridge waveguide.

Exemplary Embodiments

The person skilled in the art will recognize that additional embodiments according to the invention are contemplated as being within the scope of the foregoing generic disclosure, and no disclaimer is in any way intended by the foregoing, non-limiting examples.

Example 1

Comparison of Double and Single-Ridge LC-DFB ICLs

In one exemplary study a series of LC-DFB ICLs were fabricated on wafers grown on an n-GaSb (100) substrate using a Riber Compact 21T molecular beam epitaxy system. (See, e.g., 10. Canedy, C. L., et al. 'North American conference on molecular beam epitaxy', AVS, 1160-1162 (2008), the disclosure of which is incorporated herein by reference.) The carrier-rebalanced ICL design with 750-nm-thick separate confinement layers (SCLs) above and below the seven active stages was used for the structure. (See, e.g., I. Vurgaftman, et al., Nature Commun 2, 585 (2011), the disclosure of which is incorporated herein by reference.) An inductively coupled plasma (ICP) etching process was used to remove the layers outside of the ridge to minimize the lateral current spreading, after which a plasma-enhanced chemical-vapor-deposited silicon nitride isolation layer was used to cover the etched ridge sidewalls. The isolation layer was removed on the top of the lasers by a dry-etch step and a Ti/Pt/Au-contact was deposited as top contact. For heat removal, the ridges were electroplated prior to wafer thinning and n-type backside ohmic-contact deposition. The lasers were cleaved into various cavity lengths and mounted junction-side up on copper submounts for characterization. Broad-area and narrow-ridge FP lasers as well as LC-DFB devices were fabricated and characterized for performance and wavelength characterization.

Pulsed characterization of standard broad-area lasers with 150 μm ridge width, 2-mm cavity length, and uncoated facets yielded a threshold current density of 170 A/cm2 and slope efficiency of 550 mW/A per facet at room temperature. CW characterization of lasers with 7-μm-wide, 2-mm-long ridges etched through the active and lower cladding layers with uncoated facets (standard fabrication for single-spatial-mode ICLs) yielded a threshold current density of 200 A/cm2 and slope efficiency of 270 mW/A per facet at 20° C. The characteristics of the standard narrow-ridge lasers were used as a benchmark for comparison to the other structures reported below.

Figure 4:
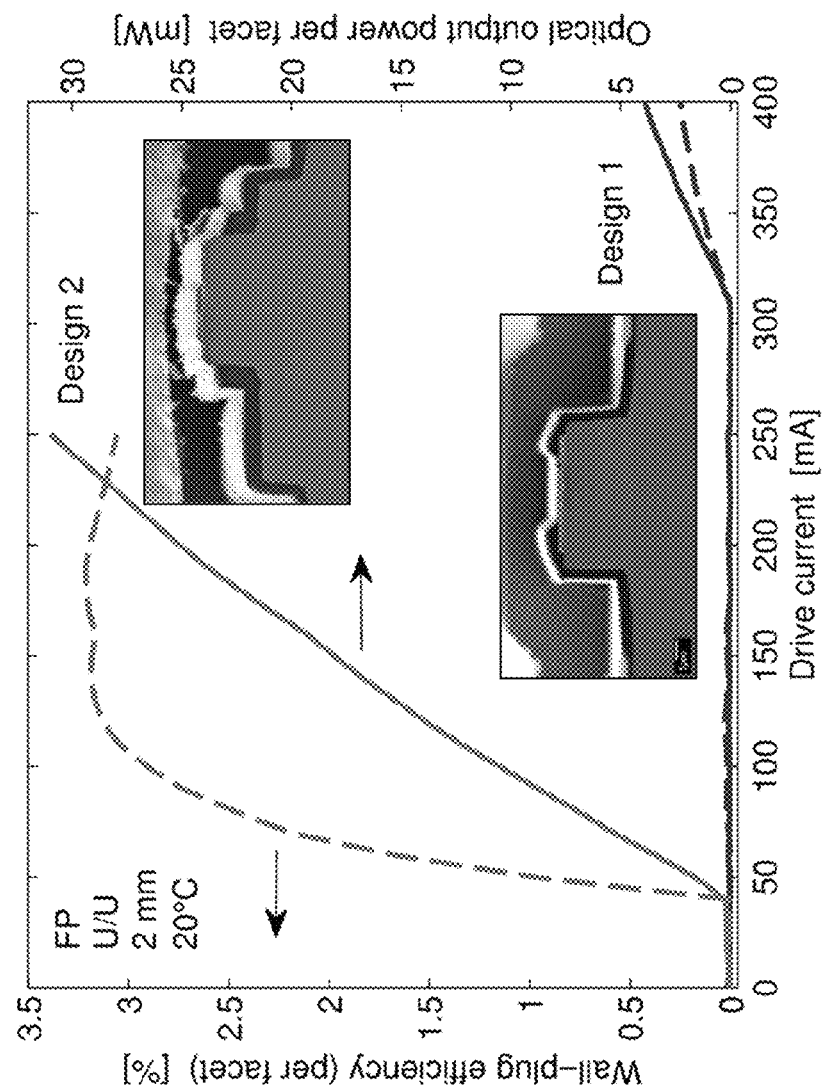
FIG. 4 provides data graphs of CW light-current (LI) characteristics (solid) of uncoated 2 mm FP ICLs of single and double-ridge designs and the corresponding total wall-plug efficiency (WPE) (dashed), and the insets provide scanning-electron micrograph cross-sections of the two designs after the ridge-etch.

Two comparative DFB devices were patterned having second-order laterally coupled gratings extending out from a narrow RWG. In the first design, subsequently called "a single-ridge ICL," the ridge etch was halted above the upper waveguide layer, leaving a few hundred nanometers of semiconductor to host the shallow-etched LC-DFB gratings while the active region remains intact. However, since a large degree of lateral current spreading was observed, a double-ridge scheme ("double-ridge ICL" in accordance with embodiments) was implemented, in which the first ridge is etched to the same depth as the single-ridge ICL for optical mode confinement, and the second ridge is etched through the active region for current confinement. For the single-ridge ICL, the ridge width was ~4.5 μm, and in the double-ridge ICL, the widths of the RWG and current-confining structures were 4 μm and 10 μm, respectively. As described above, the parameters for the ridges in the double-ridge ICL were chosen based on numerical calculations such that a) the RWG should support a single transverse mode while a reasonable amount of the evanescent electrical field should extend outside of the ridge area for coupling to a LC-DFB grating, and b) the lateral current spreading should be limited while not affecting the fundamental optical mode. The insets of FIG. 4 show scanning-electron micrograph cross-sections of the two designs after the ridge etch.

As shown, by etching gratings only a few hundred nanometers into the semiconductor structure, smaller feature sizes can be used while retaining a high degree of pattern fidelity. In this case, the use of second-order DFB gratings with a 25% duty cycle minimizes the possibility of loss into lower diffraction orders compared with higher-order DFB ICLs fabricated with larger feature sizes and deep-etched gratings, and lower-order gratings also allow for stronger DFB coupling for the same modal overlap. Second, although the etch penetrated through the ICL active region with the double-ridge ICL, the resulting smooth, flat sidewalls are comparable to the FP benchmark devices. Compared with DFB devices with corrugations etched through the active region, the two-ridge approach minimizes exposed surface area of the active region and does not require passivation of small concave features.

Prior to fabricating LC-DFB lasers, FP lasers with uncoated facets were fabricated with the ridge geometries described above. The CW light-current characteristics and corresponding wall-plug efficiency of 2-mm-long FP devices are plotted in FIG. 4. Based on the area of the 10-μm-wide ridge in the double-ridge ICL, the threshold current density is 200 A/cm$^2$ at 20° C., which is comparable to the benchmark single-ridge design. For the single-ridge ICL, without the current confinement structure, there is observed a seven-fold increase in threshold current. It is noted that, although the 10 μm ridge in the double-ridge ICL can support higher-order lateral modes, measured sub-threshold spectra indicate that emission is coupled only into the fundamental optical mode for both ridge designs (see FIG. 7). The slope and wall-plug efficiencies (per facet) increased from 46 mW/A and 0.3% for the single-ridge ICL, to 170 mW/A and 3% for the double-ridge ICL. The decrease in slope efficiency of the single-ridge ICL 2 as compared to the benchmark design is expected as the lateral current spreading certainly extends further than the optical mode, leading to a decrease of the internal quantum efficiency (IQE). Indeed, extraction of the IQE from a preliminary study of the relation between the inverse of the external differential quantum efficiency and cavity length, it is observed that a considerable decrease of the IQE on the order of a factor of four for the single-ridge ICL as compared to the benchmark design, whereas the ratio between the benchmark design and the double-ridge ICL was on the order of a factor of two. The above results are consistent with the degree of lateral current spreading being considerably reduced with the proposed double-ridge design.

Figure 5:
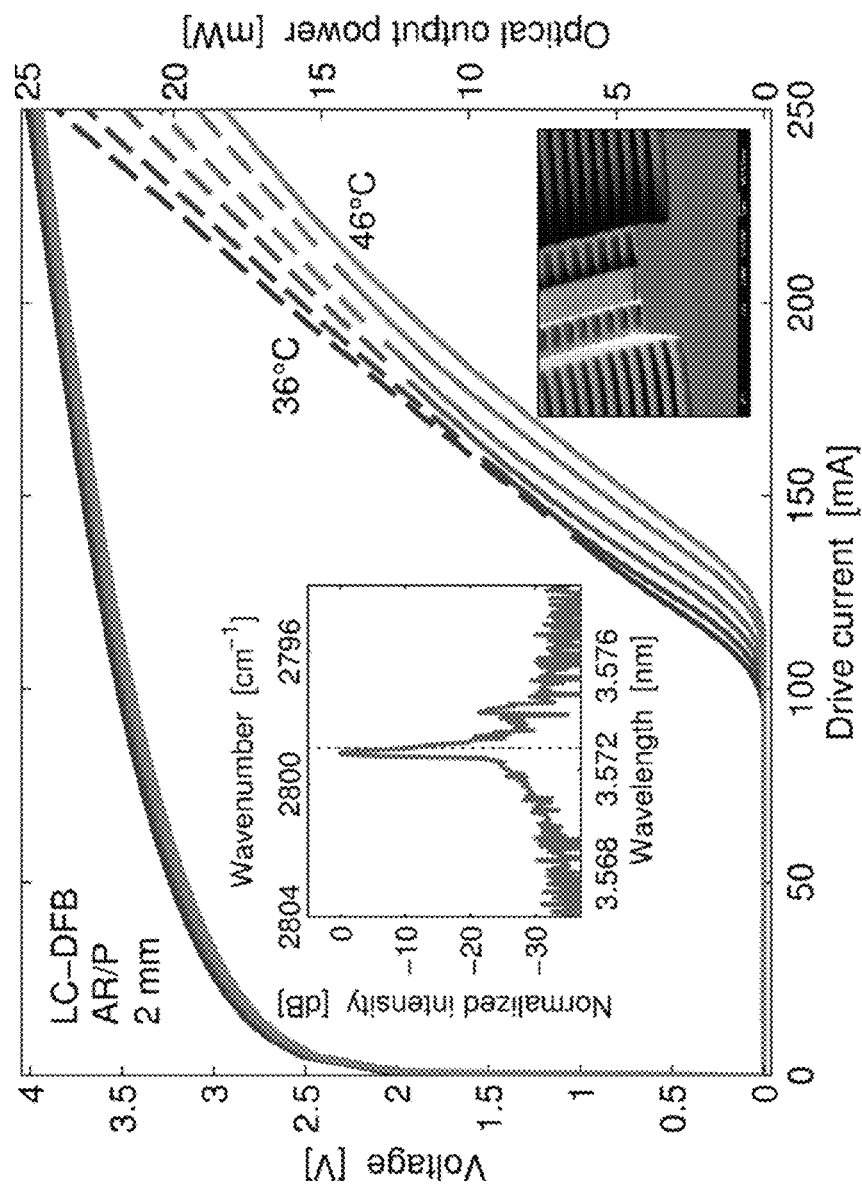
FIG. 5 provides data graphs of the power and voltage characteristics for a LC-DFB ICL in accordance with embodiments of the invention emitting close to 3.57 μm, where the solid parts of the lines signify single-mode DFB operation, and where the leftmost inset shows an emission spectrum collected from the LC-DFB ICL when driven by 160 mA at 46° C. and the vertical dashed line marks the peak of the target absorption feature of HCl, and where the rightmost inset shows a scanning-electron micrograph cross-section of a ridge with a Bragg grating extending laterally on both sides.

In order to achieve DFB operation, laterally coupled second-order Bragg gratings with a pitch of 980 nm were patterned using electron-beam lithography followed by reactive-ion etching into the upper waveguide layer, as shown in the inset of FIG. 5. The CW light-current-voltage characteristics at several heat-sink temperatures and a typical emission spectrum for a 2 mm LC-DFB laser are also plotted in FIG. 2. An anti-reflection (AR) coating with a measured reflectivity of approximately 2% was deposited on the front laser facet, and a thin dielectric passivation layer was deposited on the back facet (resulting in a reflectivity of approximately 30%). Mode-hop-free single-frequency operation was observed at temperatures above 36° C. with single-facet output power as high as 18 mW at 46° C. The corresponding slope efficiency of the laser was 180 mW/A.

Figure 6:
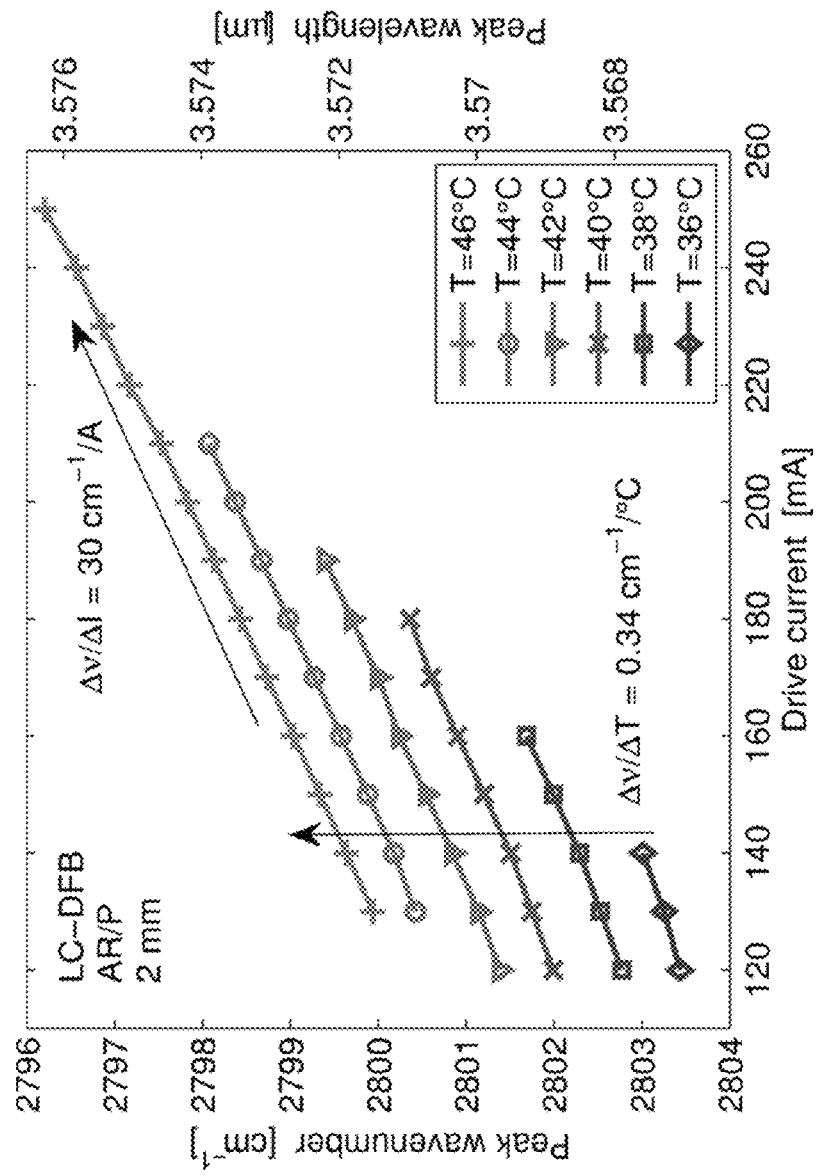
FIG. 6 provides data graphs of the peak emission wavenumber of the LC-DFB ICL of FIG. 5 as a function of drive current up to 250 mA and for temperatures between 36° C. and 46° C., where wavelength tuning of 30 cm-1/A (40 nm/A) and 0.34 cm-1/° C. (0.43 nm/° C.) as a function of current and temperature are measured.
Figure 7:
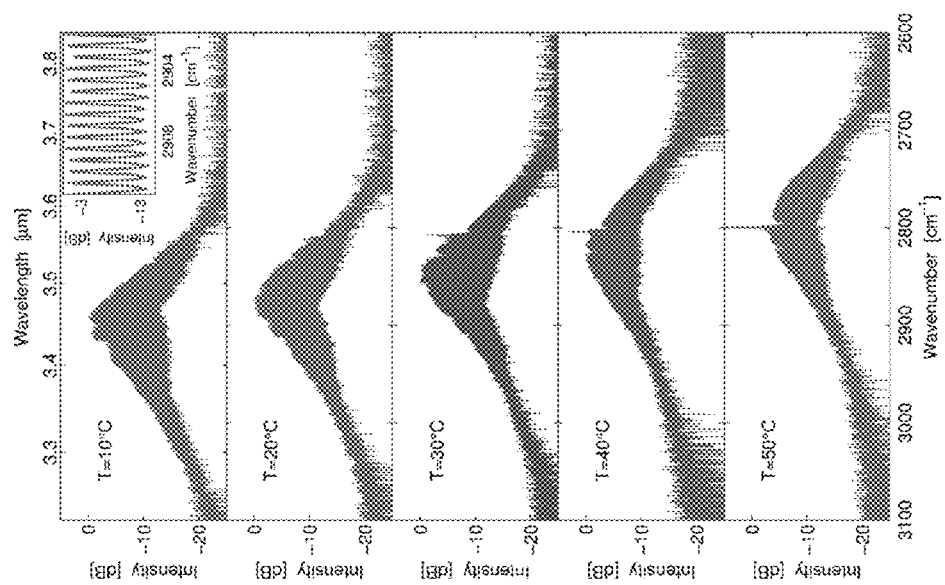
FIG. 7 provides data graphs of sub-threshold spectra collected from an LC-DFB ICL with a second order Bragg grating and an AR/P coating in accordance with embodiments of the invention, where the target wavelength for HCl detection is 3.5728 μm (2798.9 cm-1), and where the inset is a zoomed-in region showing the single periodicity of the spectrum, which indicates that there is only one excited optical mode.

FIG. 6 shows the measured peak emission wavelength of a 2 mm LC-DFB ICL for a range of heat-sink temperatures and operating currents. It can be observed that the LC-DFB ICL demonstrates wavelength tuning rates of 30 cm-1/A (40 nm/A) and 0.34 cm-1/° C. (0.43 nm/° C.) as a function of current and temperature, respectively. The main reason for the high-temperature onset of DFB operation is a large detuning of the gain peak and DFB grating Bragg wavelength. As seen in FIG. 7, the temperature-dependent laser gain spectrum is well aligned with the Bragg wavelength at 3.57 μm only for temperatures greater than 30° C.

For the purpose of long-term reliability, accelerated aging tests have also been performed on limited devices, currently resulting in more than 4500 hours of accumulated testing, mostly at mount temperatures of 40° C. and drive currents of 200 mA or higher. So far, all devices that passed the infant mortality phase have survived without any measurable degradation either in output power or wavelength stability.

These results demonstrate stable, high-power, and reliable single-frequency LC-DFB ICLs emitting at 3.57 μm. The reported double-ridged ICL structure, in accordance with embodiments, eliminates the need of etching laser ridges through the active region of the laser close to the optical mode. The above results also indicate the possibility of achieving reliable single-frequency lasers with tens of milliwatts of output power in the 3 to 4 μm wavelength range.

Example 2

Performance Characteristics of AR and HR Coated LC-DFB ICLs

Figure 8:
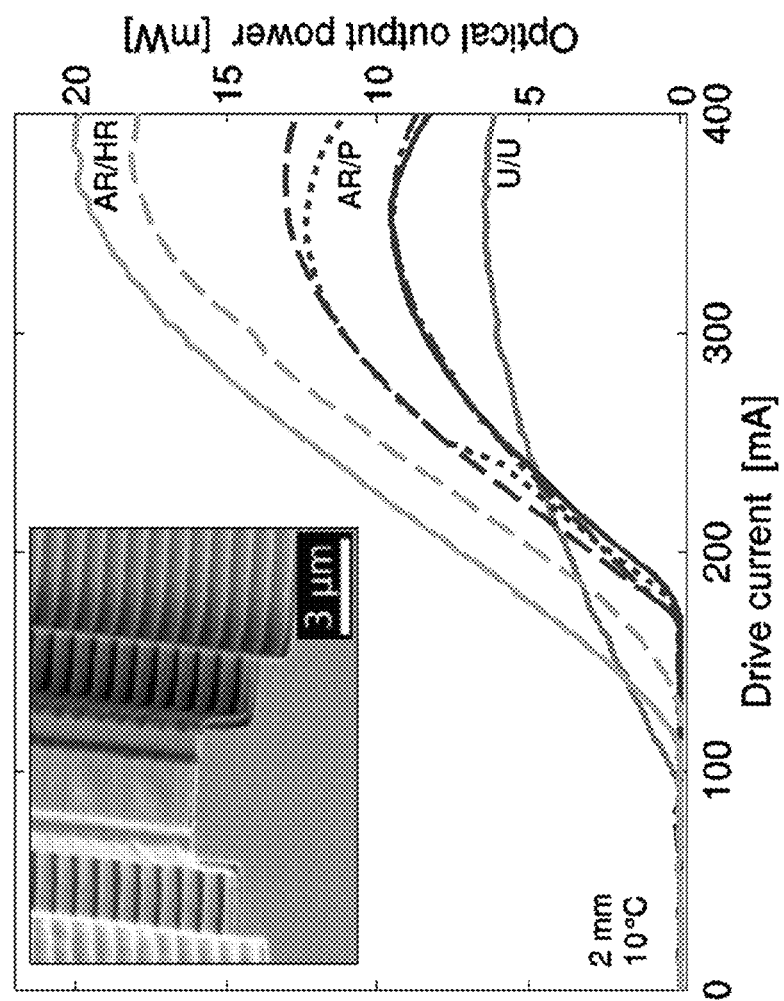
FIG. 8 provides data graphs of light-current characteristics of several double-ridge DFB ICLs measured at 10° C. with different facet coating configurations: both facets uncoated (U/U), front facet AR-coated, back facet passivated (AR/P), and front facet AR-coated, back facet HR-coated (AR/HR), where the inset shows scanning electron micrograph of a double-ridge ICL in accordance with embodiments of the invention.

In a second study, ICLs, in accordance with embodiments were fabricated from an epitaxial wafer similar in design to ones described above. In these exemplary devices, the n-type cladding is composed of InAs/AlSb layers with a total thickness of 1.5 μm above the active region and 2.8 μm below, and the active region consists of seven ICL stages between two GaSb separate confinement layers (SCLs). Devices were processed by first defining a narrow-width (~3 μm) RWG by contact lithography. The waveguide was then etched into the semiconductor to the top SCL by reactive ion etching (RIE). After the RWG was fabricated, a second-order lateral Bragg grating was patterned directly adjacent to the ridge sidewalls by first defining the grating with electron-beam lithography and then transferring the pattern into the remaining top SCL by the same RIE fabrication process. The dimensions of the grating structure were 925 nm pitch with a 75% duty cycle and a depth of 300 nm, just enough so that the grating etch did not penetrate the ICL stages. For current confinement, a second 9-μm-wide ridge was defined with the RWG at the center. The second ridge was etched to the bottom SCL, as shown in the inset in FIG. 8.

As described above, simulations show that the fundamental optical mode supported by the first ridge is not perturbed by the wider ridge, since the optical mode does not extend significantly beyond the narrow RWG. After fabricating the RWG, lateral grating, and current confinement ridge, the devices were insulated with silicon nitride except for a narrow strip on the top of the RWG, followed by deposition of an ohmic contact and a thick gold electroplated layer for heat extraction. The backside of the wafer was then thinned by mechanical lapping to a thickness of approximately 100 μm to facilitate cleaving into individual device chips. Finally, backside ohmic contacts of Pd/Ge/Au were deposited and annealed at 260° C.

Before cleaving the wafer into individual laser chips, anti-reflection (AR) and high-reflection (HR) coatings were deposited onto the front and back facets. The multi-layered coatings were designed and optimized for the wavelength of interest with reflectivity of approximately 1% and 73% for the AR and HR coatings, respectively. The effect of different facet coating configurations is clear from FIG. 8, which shows single-mode light-current characteristics of several DFB ICLs employing the double-ridge design in accordance with embodiments. Although there are slight variations in fabrication, there is consistency in device-to-device performance for a given facet coating configuration. As compared to devices with uncoated facets (U/U), having the front facet AR-coated increases the mirror loss and thus the current threshold. For these AR-coated devices, the back facet was passivated with a thin film of alumina, resulting in approximately the same reflectivity as the uncoated facets. The increase in threshold current was reduced with a back-facet HR coating in addition to the AR coating on the front facet.

Figure 9:
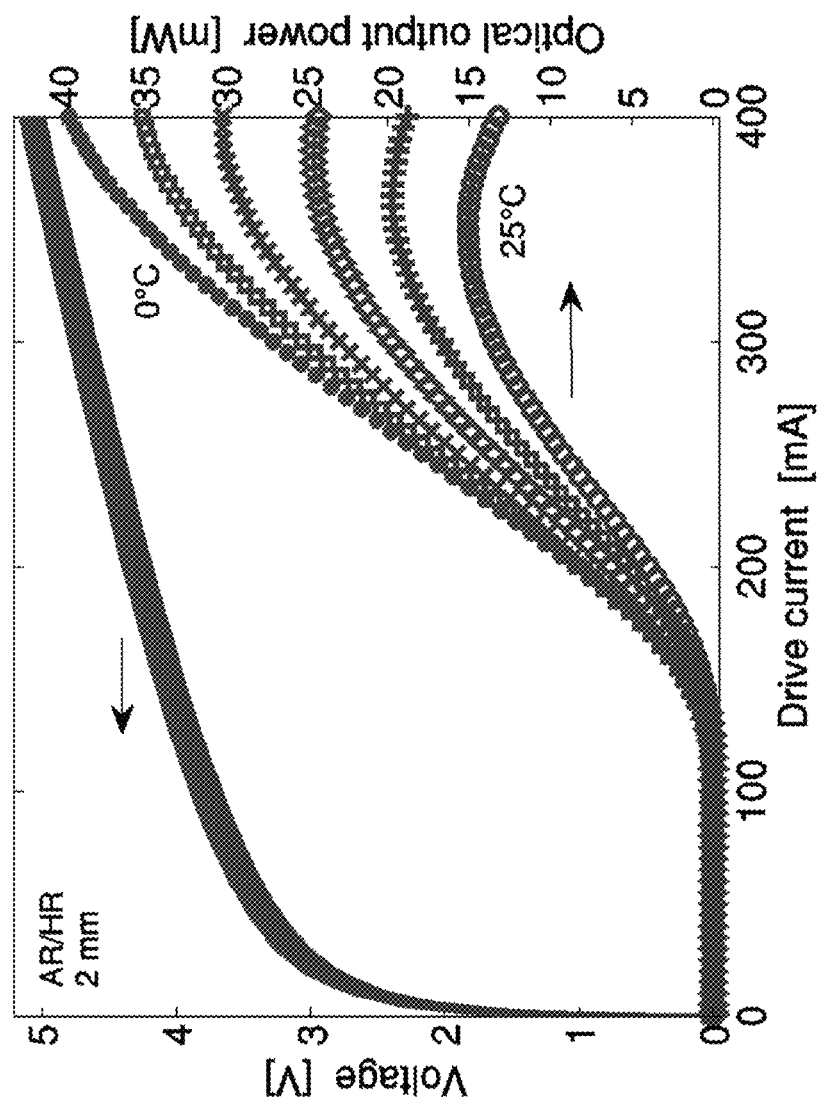
FIG. 9 provides data graphs of the performance of an AR/HR-coated DFB ICL, in accordance with embodiments of the invention, measured in 5° C. increments, with maximum observed optical output power of 20 mW at 20° C. and 40 mW at 0° C.
Figure 10:
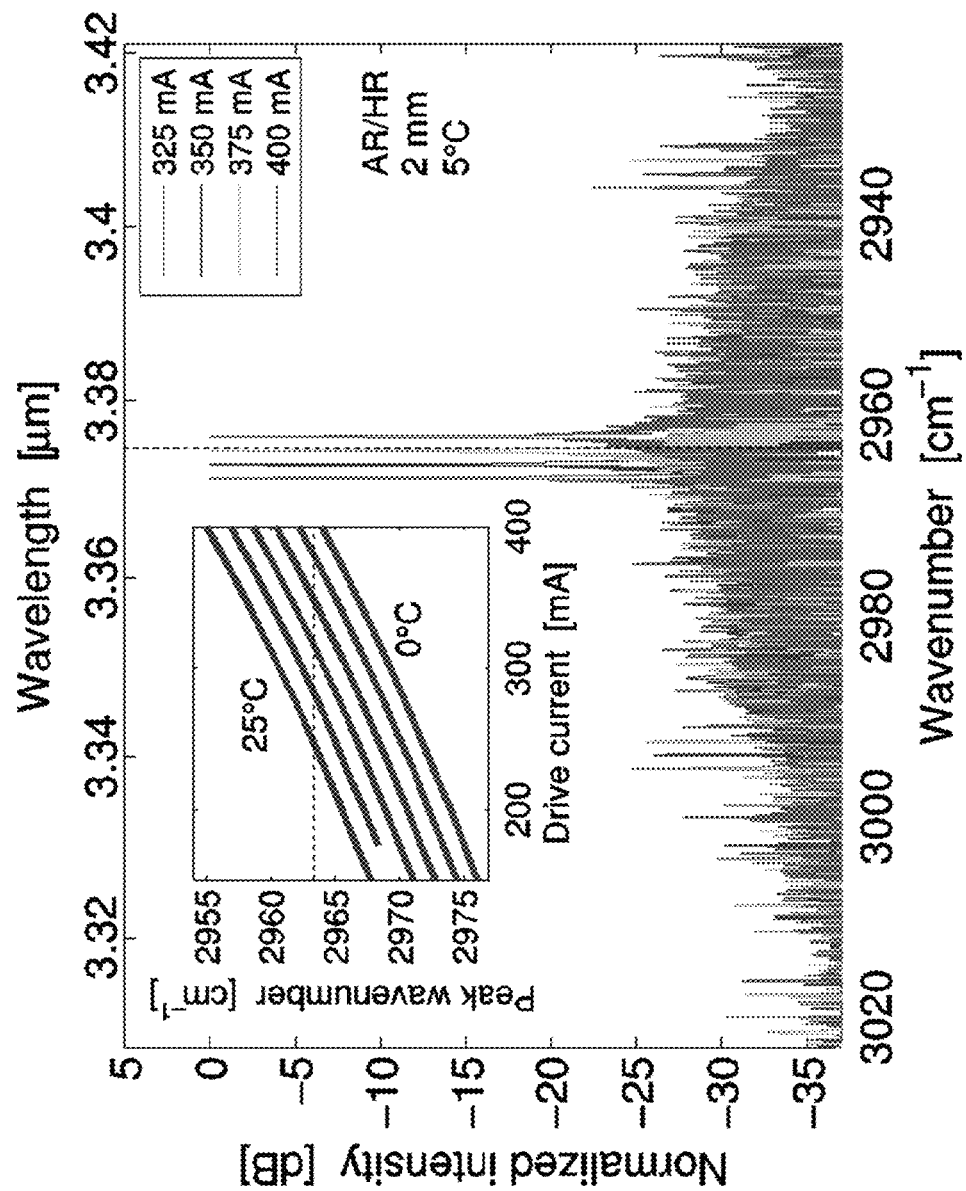
FIG. 10 provides data graphs of emission spectra collected from a double-ridge DFB ICL with SMSR of at least 25 dB in accordance with embodiments of the invention, where the inset provides current and temperature tuning characteristics of the same device, and the dotted lines represent the targeted absorption feature of hydrogen chloride at 2963.3 $cm^{-1}$.

The ICLs were hermetically sealed in TO-3 packages with internal thermal control for efficient heat extraction. The optical output power was measured with a Molectron thermopile detector. At 20° C., the thermal rollover-limited output power was 20 mW and at the lowest tested temperature of 0° C., the maximum output power reached 40 mW, as shown in FIG. 9. At maximum output power, the wall-plug efficiency based on emission from the AR facet was 1.9%. The spectral characteristics were collected at a resolution of 0.125 $cm^{-1}$ using a Thermo Nicolet FTIR spectrometer with a cooled InSb detector. Over the entire range of testing conditions, single-mode emission was observed with a SMSR of more than 25 dB and current and temperature tuning rates of 50 $cm^{-1}$/A and 0.35 $cm^{-1}$/° C., respectively, as shown in FIG. 10.

The reason for the increased output power for these devices, as compared to the previously reported devices, is the larger overlap of the fundamental RWG mode and the DFB grating due to optimized waveguide dimensions. More specifically, the RWG is narrower and the grating is etched about 100 nm closer to the active region. Based on scanning electron micrographs and electromagnetic simulations, the grating overlap has increased by nearly a factor of three and the grating coupling factor, κ, has increased accordingly from approximately 7 $cm^{-1}$ to 18 $cm^{-1}$, based on the expression found in W. Y. Choi, J. C. Chen, and C. G. Fonstad, Jpn. J. Appl. Phys., Part 1 35(9A), 4654-4659 (1996), the disclosure of which is incorporated herein by reference. The result is that DFB ICLs are over-coupled with κL≈3.5, where L=2 mm is the cavity length, allowing for single-mode operation over a broader range of temperature and current compared conventional devices. (See, e.g., S. Forouhar, et al., Appl. Phys. Lett. 105(5), 051110 (2014), the disclosure of which is incorporated herein by reference.) Sub-threshold Hakki-Paoli measurements of devices with and without gratings indicate that the grating only introduces additional optical losses of around 2-3 $cm^{-1}$.

These results demonstrate that laterally coupled ICLs with a double-ridge design, in accordance with embodiments, are capable of emitting 20 mW of single-mode output power at 20° C. and 40 mW at 0° C., which represents a significant improvement over previous results. Improved fabrication has led to increased coupling to the second-order Bragg grating, extending the range of operating conditions for single-mode emission. The laser emission wavelength is targeted for a hydrogen chloride absorption feature at 2963.3 $cm^{-1}$ (3.3746 μm), and the emission is continuously tunable over 20 $cm^{-1}$ without mode hops. At 5° C., the target wavenumber is achieved with more than 34 mW of single-mode output power.

Such type-II interband cascade lasers (ICLs) in accordance with embodiments represent an enabling technology for laser absorption spectroscopy in the 3 to 5 μm wavelength range. Instruments operating in this spectral regime can precisely match strong absorption lines of several gas molecules of interest in atmospheric science and environmental monitoring, specifically methane, ethane, and other alkanes. Compared with non-semiconductor-based laser technologies, ICLs can be made more compact and power efficient, ultimately leading to more portable, robust, and manufacturable spectroscopy instruments.

Such compact, single-frequency lasers operating in the 3 to 5 μm range can access a wealth of scientifically important gas molecules and there isotopes through the technology of tunable laser absorption spectroscopy. Thus, fabrication techniques that mature the technology of mid-IR semiconductor lasers increases the precision and accuracy in the science field to which it is applied.

What is claimed is:

1. A interband cascade laser comprising:
   a substrate having disposed there atop an active region of semiconductor quantum well structures and at least one confinement layer disposed atop and below the active region;
   an elongated waveguide ridge disposed atop the top confinement layer having characteristic width and length dimensions and being formed of a plurality of epitaxial layers, the longitudinal dimension of the waveguide ridge defining a laser cavity configured to employ intersubband electronic transitions;
   a current confining ridge having a characteristic current confining width, the current confining ridge extending distally from the lateral edge of the waveguide ridge to a terminating edge, the terminating edge extending through both the top confinement layer and at least partially through the active region such that lateral current spread from said waveguide ridge is impeded from propagating beyond said terminating edge;
   a pair of distributed feedback gratings comprising a plurality of periodic vertical corrugations disposed atop the current confining ridge adjacent to the longitudinal edges of the waveguide ridge and extending outward from the longitudinal edges of the waveguide ridge to the terminating edge of the current confining ridge in a plurality of laterally extending parallel rows, wherein the corrugations have characteristic modulation depth and pitch, and wherein the corrugations are disposed through the top confinement layer, but do not penetrate the active region;
   a dielectric layer conformally disposed atop the distributed feedback grating;
   a conductive contact layer disposed atop the dielectric layer and elongated waveguide ridge;
   wherein the width of the waveguide ridge and the modulation depth and pitch of the corrugations are configured such that the corrugations have a coupling coefficient sufficient to interact with the active region of the laser to impose single-mode emission at specific engineered wavelengths thereon; and
   wherein the width of the current confining ridge is configured such that the terminating edge does not interact with the optical coupling of the waveguide ridge and the corrugations.

2. The interband cascade laser of claim 1, wherein the corrugations have an open profile having a modulation depth, d, that is equal to or less than the pitch, Λ, of the periodic vertical corrugations such that the aspect ratio of the corrugations, d/Λ is less than 1.

3. The interband cascade laser of claim 1, wherein the dielectric layer is formed of a material at a thickness sufficient to isolate the optical mode guided by the laser waveguide from the conductive contact later;
   wherein the dielectric material is transparent at the laser emission wavelength; and wherein the dielectric material has a lower refractive index than the effective index of the laser active region thereby confining light to the laser ridge.

4. The interband cascade laser of claim 1, wherein the dielectric layer is configured to allow for the conduction of thermal energy from the active region into the contact layer.

5. The interband cascade laser of claim 1, wherein the waveguide has a width of from 3 to 6 µm.

6. The interband cascade laser of claim 1, wherein the current confining ridge has a width of from 8 to 12 µm.

7. The interband cascade laser of claim 1, wherein the portion of the current confining ridge on each side of the waveguide has a width at least as great as the width of the waveguide.

8. The interband cascade laser of claim 1, wherein the terminating edge extends completely through the active region to the bottom confinement layer.

9. The interband cascade laser of claim 1, wherein the corrugations form a lateral Bragg grating.

10. The interband cascade laser of claim 1, wherein the waveguide and distributed feedback gratings are dimensions to produce a laser emission within a waveband of 3 to 6 µm.

11. A method of forming an interband cascade layer comprising:
  epitaxially growing an ICL wafer atop a substrate, the ICL wafer comprising at least an active region of semiconductor quantum well structures and at least one confinement layer disposed atop and below the active region, and further comprising at least an upper cladding layer disposed atop the top confinement layer;
  lithographically patterning and etching an elongated waveguide ridge having characteristic width and length dimensions, the longitudinal dimension of the waveguide ridge defining a laser cavity configured to employ intersubband electronic transitions through the upper cladding layer such that the elongated waveguide ridge is disposed atop the top confinement layer;
  epitaxially growing a further cladding layer atop the waveguide ridge;
  lithographically patterning a distributed feedback grating comprising a plurality of vertical corrugations extending outward from the longitudinal edges of the waveguide ridge in a plurality of laterally extending parallel rows;
  plasma etching the patterned plurality of vertical corrugations into the ICL wafer such that the corrugations have characteristic modulation depth and pitch, and such that the corrugations are disposed through the top confinement layer, but do not penetrate the active region;
  lithographically patterning a current confining ridge having a characteristic current confining width, the current confining ridge extending distally from the lateral edge of the waveguide ridge to a terminating edge;
  plasma etching current confining ridge such that the plurality of corrugations between the terminating edges and the waveguide ridge are preserved, and such that the terminating edge extends through both the top confinement layer and at least partially through the active region such that lateral current spread from said waveguide ridge is impeded from propagating beyond said terminating edge;
  vapor depositing a dielectric layer conformally atop the distributed feedback grating;
  electrodepositing a conductive contact layer atop the dielectric layer and elongated waveguide ridge;
  wherein the width of the waveguide ridge and the modulation depth and profile of the corrugations are configured such that the corrugations have a coupling coefficient sufficient to interact with the active region of the laser to impose single-mode operation and emission at specific engineered wavelengths thereon; and
  wherein the width of the current confining ridge is configured such that the terminating edge does not interact with the optical coupling of the waveguide ridge and the corrugations.

12. The method of claim 11, wherein the plasma etching utilizes an anisotropic non-selective plasma etching process.

13. The method of claim 11, wherein the corrugations have an open profile having a modulation depth, d, that is equal to or less than the pitch, Λ, of the periodic vertical corrugations such that the aspect ratio of the corrugations, d/Λ is less than 1.

14. The method of claim 11, wherein the dielectric layer is formed of a material at a thickness sufficient to isolate the optical mode guided by the laser waveguides from the contact later, and to allow for the conduction of thermal energy from the active region into the contact layer;
  wherein the dielectric material is transparent at the laser emission wavelength; and
  wherein the dielectric material has a lower refractive index than the effective index of the laser active region thereby confining light to the laser ridge.

15. The method of claim 11, wherein the waveguide has a width of from 3 to 6 µm.

16. The method of claim 11, wherein the current confining ridge has a width of from 8 to 12 µm.

17. The method of claim 11, wherein the portion of the current confining ridge on each side of the waveguide has a width at least as great as the width of the waveguide.

18. The method of claim 11, wherein the terminating edge extends completely through the active region to the bottom confinement layer.

19. The method of claim 11, wherein the corrugations form a lateral Bragg grating.

20. The method of claim 11, wherein the waveguide and distributed feedback gratings are dimensions to produce a laser emission within a waveband of 3 to 6 µm.

* * * * *

UNITED STATES PATENT AND TRADEMARK OFFICE
CERTIFICATE OF CORRECTION

PATENT NO. : 9,438,011 B2
APPLICATION NO. : 14/824933
DATED : September 6, 2016
INVENTOR(S) : Clifford F. Frez et al.

Page 1 of 1

It is certified that error appears in the above-identified patent and that said Letters Patent is hereby corrected as shown below:

In the Claims

In Claim 14, Line 33, delete "later" and add --layer--.

Signed and Sealed this
Twenty-fifth Day of April, 2017

Michelle K. Lee
*Director of the United States Patent and Trademark Office*